(12) United States Patent
Iwanczyk et al.

(10) Patent No.: US 7,129,501 B2
(45) Date of Patent: Oct. 31, 2006

(54) RADIATION DETECTOR SYSTEM HAVING HEAT PIPE BASED COOLING

(75) Inventors: Jan S. Iwanczyk, Los Angeles, CA (US); Valeri D. Saveliev, Rescda, CA (US); Shaul Barkan, Stevenson Ranch, CA (US)

(73) Assignee: SII Nanotechnology USA, Inc., Northridge, CA (US)

( * ) Notice: Subject to any disclaimer, the term of this patent is extended or adjusted under 35 U.S.C. 154(b) by 112 days.

(21) Appl. No.: 10/880,262

(22) Filed: Jun. 29, 2004

(65) Prior Publication Data

US 2005/0285046 A1  Dec. 29, 2005

(51) Int. Cl.
*G01T 1/24* (2006.01)
(52) U.S. Cl. .................. 250/370.15; 250/352
(58) Field of Classification Search ........... 250/370.09, 250/370.14, 370.15, 338.4, 493.1, 492.2, 250/505.1, 504 R, 352
See application file for complete search history.

(56) References Cited

U.S. PATENT DOCUMENTS

| | | | | |
|---|---|---|---|---|
| 4,517,459 A | * | 5/1985 | Richter et al. | 250/261 |
| 5,235,817 A | * | 8/1993 | Gallagher et al. | 62/51.1 |
| 5,409,547 A | * | 4/1995 | Watanabe et al. | 136/204 |
| 5,486,703 A | * | 1/1996 | Lovin et al. | 250/492.3 |
| 5,504,924 A | * | 4/1996 | Ohashi et al. | 361/676 |
| 5,811,816 A | * | 9/1998 | Gallagher et al. | 250/370.15 |
| 6,351,951 B1 | * | 3/2002 | Guo et al. | 62/3.7 |
| 6,370,881 B1 | * | 4/2002 | Maydanich | 62/3.2 |
| 6,377,659 B1 | * | 4/2002 | Snyder et al. | 378/142 |
| 6,474,074 B1 | * | 11/2002 | Ghoshal | 62/3.7 |
| 6,565,815 B1 | * | 5/2003 | Chang et al. | 422/198 |
| 6,573,509 B1 | * | 6/2003 | Radley et al. | 250/397 |
| 6,608,429 B1 | * | 8/2003 | Snyder | 313/36 |
| 6,815,900 B1 | * | 11/2004 | Ahmad et al. | 315/111.21 |
| 6,978,828 B1 | * | 12/2005 | Gunawardana | 165/104.26 |
| 7,056,017 B1 | * | 6/2006 | Daniel et al. | 378/200 |
| 2002/0104318 A1 | * | 8/2002 | Jaafar et al. | 62/3.6 |
| 2002/0139123 A1 | * | 10/2002 | Bell | 62/3.7 |
| 2002/0148234 A1 | * | 10/2002 | Bell | 62/3.3 |
| 2003/0136909 A1 | * | 7/2003 | Plante | 250/338.4 |
| 2004/0050534 A1 | * | 3/2004 | Malone et al. | 165/80.3 |

* cited by examiner

*Primary Examiner*—David Porta
*Assistant Examiner*—Faye Boosalis
(74) *Attorney, Agent, or Firm*—Sheppard Mullin Richter & Hampton LLP

(57) ABSTRACT

A radiation detector system having a heat pipe based cooling. The radiation detector system includes a radiation detector thermally coupled to a thermo electric cooler (TEC). The TEC cools down the radiation detector, whereby heat is generated by the TEC. A heat removal device dissipates the heat generated by the TEC to surrounding environment. A heat pipe has a first end thermally coupled to the TEC to receive the heat generated by the TEC, and a second end thermally coupled to the heat removal device. The heat pipe transfers the heat generated by the TEC from the first end to the second end to be removed by the heat removal device.

19 Claims, 2 Drawing Sheets

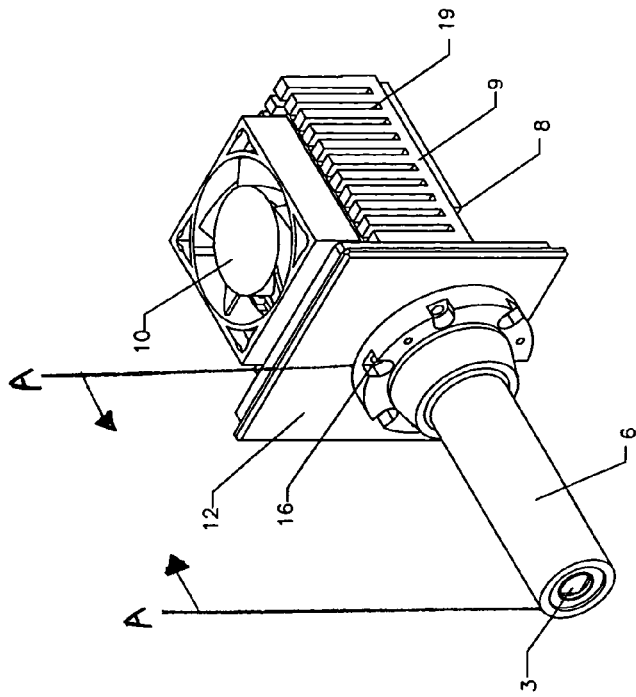
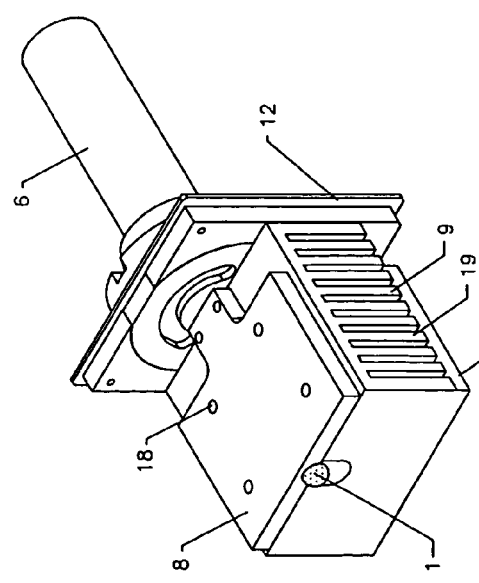
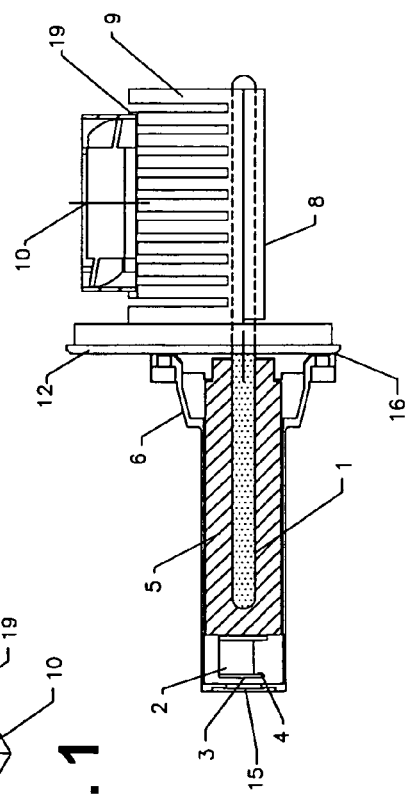
FIG. 1
FIG. 2
FIG. 3

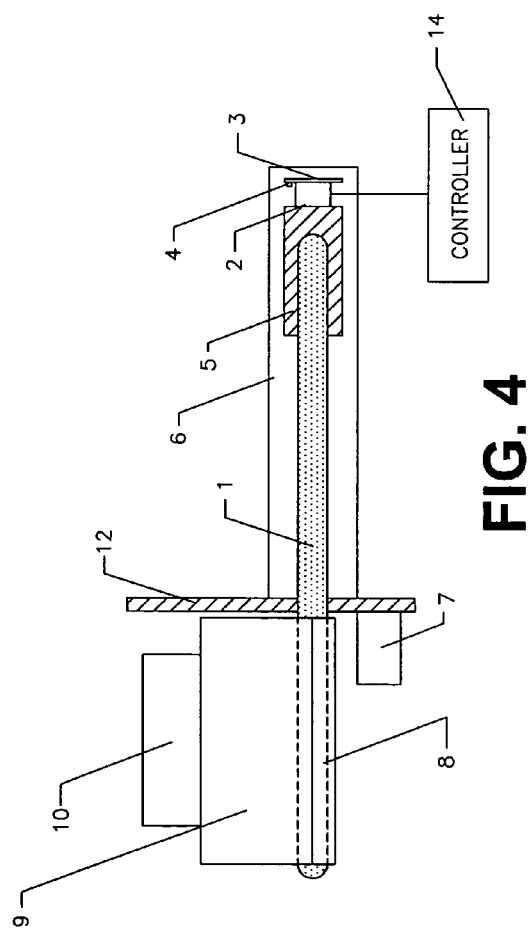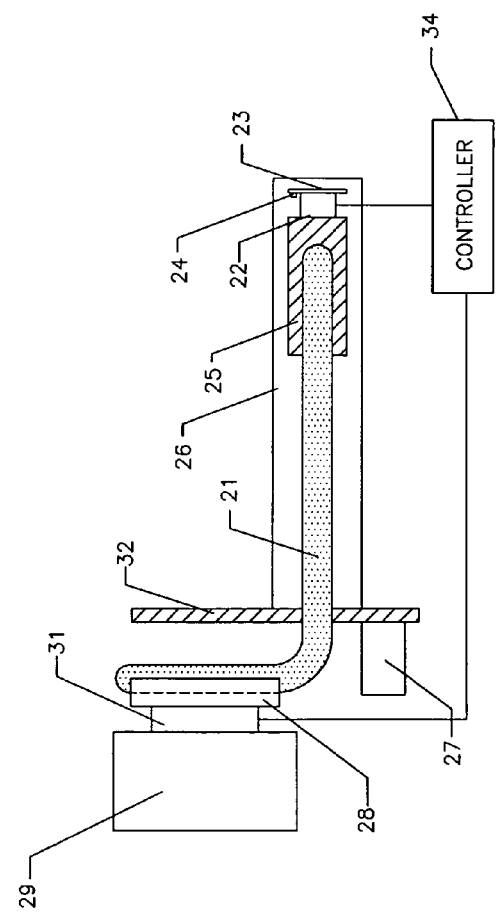

RADIATION DETECTOR SYSTEM HAVING HEAT PIPE BASED COOLING

STATEMENT REGARDING FEDERALLY SPONSORED RESEARCH DEVELOPMENT

This invention was made with Government support under Small Business Innovation Research program (Grant No. DE-FG02-03ER83873) awarded by the Department of Energy. The Government has certain rights in this invention.

FIELD OF THE INVENTION

The present invention is related to radiation detector systems, and more particularly to a heat pipe based system and method for cooling in a radiation detector system.

BACKGROUND

In radiation detector systems, cooling of the radiation detector and input components of the amplification circuit generally reduces electronic noise and enhances spectroscopic performance of the system. Liquid nitrogen ($LN_2$) has traditionally been used for such cooling purposes.

A major weakness of $LN_2$ cooling is the necessity for a large reservoir (i.e., dewar). Also, using $LN_2$ is hazardous, inconvenient, and pricey. By way of example, severe burns can result from skin contact with $LN_2$. In addition, the $LN_2$ dewars must be refilled on a regular basis (e.g., twice per week) in order to maintain the detector at operating temperature.

Further, radiation detectors are frequently mounted at locations that are not easily accessible, and refilling the $LN_2$ dewar is often an unsafe and uncomfortable operation, during which a user must carefully follow safety procedures or risks injury. The cost of purchasing, storing and handling $LN_2$ over the lifetime of a radiation detector can be very high. Since $LN_2$ evaporates from both the detector dewar and the storage tank, a waste cannot be prevented. Also, during the refilling process, significant amounts of $LN_2$ are typically lost due to evaporation and spillage. Thus, in addition to the expense of $LN_2$ consumed for cooling the detector, additional expenses are incurred because of $LN_2$ loss during dewar refilling and storage.

By way of example, about ten liters of $LN_2$ per week evaporate from a standard detector dewar, and about the same amount is lost during transfer and through evaporation from the storage tank. Therefore, a standard 160-liter storage tank lasts about eight weeks and must be refilled an average of 6.5 times per year. Hence, the annual cost of cooling an $LN_2$-based detector for operation is approximately $2,500 per year. To the annual cost of $LN_2$ must be added the cost of labor for handling $LN_2$ and refilling the detector dewar. Even if this labor averages only twenty minutes per week, it can add hundreds of dollars per year to the cost of servicing an $LN_2$-cooled detector.

In addition, the handling of $LN_2$ often requires the purchase of a special liability insurance. Further, conventional $LN_2$-cooled radiation detectors are bulky, due to their large capacity (e.g., nine liters) dewars, and typically weigh over forty pounds. Placed at the end of a long support structure, an $LN_2$-cooled detector is cantilevered, and is vulnerable to vibrations that interfere with high resolution imaging in its applications in electron microscopes.

Radiation detectors utilizing thermo electrical cooling (TEC) (i.e., Peltier cooling) are being frequently used in many applications. The development of silicon structures such as low leakage current p-i-n and drift type detectors as well as high resistivity compound semiconductor detectors ($HgI_2$, CdTe, CdZnTe and others) allow for construction of high energy resolution, spectroscopy systems without requiring $LN_2$ cooling. Also, attempts are being made to develop Si[Li] systems that can operate with TEC cooling.

The TEC has distinctive advantages over the use of $LN_2$. A TEC is a small heat pump that has no moving parts and can be used in various applications where space is limited and reliability is very important. The TEC operates using direct current by moving heat from one side of the module to the other with current flow and principles of thermodynamics. The theories behind the operation of TEC can be traced back to the early 1800's when Jean Peltier discovered that there is a heating or cooling effect when electric current passes through two conductors.

A typical single stage TEC includes two ceramic plates with p-type and n-type semiconductor material (e.g., bismuth telluride) between the plates. The elements of the semiconductor material are connected electrically in series and thermally in parallel. When a positive voltage is applied to the n-type thermo-element, electrons pass from the p-type thermo-element to the n-type thermo-element and cold side temperature decreases as heat is absorbed. The heat absorption (cooling) is proportional to the current and the number of semiconductor element pairs. The heat is transferred to the hot side of the cooler, where it is dissipated into a heat sink and/or the surrounding environment.

Although the amount of TEC cooling is proportional to the current applied, the power dissipated by Joule heating in the TEC is proportional to the square of the current, and it can be shown that half of this Joule heat must be pumped from the cold junction. For this reason, an increase in current above a certain level will result in less net cooling because the Joule heating is increasing at a faster rate than the cooling.

A multi-stage TEC is essentially two or more single stage TECs stacked vertically with fewer thermo-elements in each ascending stage. The multi-stage TECs are used to achieve larger temperature differential between cold and hot sides.

Despite its many advantages, the TEC is inferior to $LN_2$ when it comes to heat pumping capacities and the lowest achievable temperature. However, in many cases use of the thermo electrical cooling is sufficient to achieve the desired performance characteristics of a spectroscopy system. Nevertheless, the above listed deficiencies typically impose strict limitations on the design of the spectrometer in terms of the placement of the cold components and dissipation of the heat generated by the TEC. In particular, it is difficult to extract heat from spectrometers having a configuration including a long probe design.

The long probe designs are often used in applications such as electron microscopy and many other x-ray fluorescence measurements. The detector needs to be placed in proximity to the samples being examined in order to assure a large solid angle of measurement. Very often the access to the sample is limited, for example, by electron focusing lenses or/and other instruments and objects including the sample holder.

For this reason, a front-end of the spectrometer is constructed as a long cylinder with a small diameter and the detector is placed at the front of the cylinder behind an entrance window. If the TEC is situated in proximity to the detector, there is a long path for the heat from the TEC to dissipate to the surrounding environment. A copper rod is typically used to conduct heat to an external radiator or a radiator and fan. Despite the fact that copper provides a good heat conductivity, there usually is a large temperature gradient generated along the heat conductor, thus elevating temperature at the hot side of the TEC.

By way of example, the temperature gradient generated due to 5 W heat energy conducting along a copper rod having 1.2 cm diameter and 15 cm length is 17° C. This phenomenon further limits the lowest achievable temperature at the cold side (i.e., the end thermally coupled to the radiation detector) of the TEC. In order to overcome this problem, other designs involve a water or coolant circulation at the base plate which is thermally coupled to the hot side of the TEC. This solution itself brings additional complexity and cost to the system. Moreover, the coolant flow may introduce vibration and noise to the spectrometric system.

An example of using a copper rod to conduct heat from the detector to the cold side of the TEC and then attaching the hot side to a copper base cooled by flowing water is described in U.S. Pat. No. 5,075,555 to Woldseth et al. Some of the other concerns associated with this method are as follow. First, the long copper rod ("cold finger") causes a big loss in the cooling efficiency due to thermal radiation from the cold copper rod to the room temperate wall surfaces. The multi-stage TEC is a very low efficiency device, and losing temperature due to surface thermal radiation further complicates the design of an additional radiation shield surrounding the whole length of the copper rod (in some microanalysis products, a length of 10 inches (25.4 cm) or more). This radiation shield tube also needs to be cooled down by the same TEC.

Further, the TEC top stage is very fragile, and connecting it to the copper rod, even through a copper braid ("flexi cold finger"), can frequently cause the top stage of the TEC to break down as a result of mechanical shocks. In addition, cooling down the hot side of the TEC with flowing water is a relatively expensive solution. A chiller or a water radiator needs to be added, and in addition to the extra cost, it is also an additional bulky device which is inconvenient to add in many applications.

Therefore, a cooling system for a radiation detector system that overcomes one or more of the problems associated with above-mentioned $LN_2$ cooling or TEC/copper rod cooling is desired.

SUMMARY

In an exemplary embodiment of the present invention, a radiation detector system includes a radiation detector, front end electronics and a TEC thermally coupled to the radiation detector and the electronics for cooling purposes, whereby heat is generated primarily by the TEC. A heat removal device dissipates the heat generated by the TEC and the detector with its electronics to surrounding environment. A heat pipe has a first end thermally coupled to the TEC to receive the heat generated by the TEC, and a second end thermally coupled to the heat removal device. The heat pipe transfers the heat generated by the TEC from the first end to the second end to be removed by the heat removal device. The heat pipe is a simple device that can efficiently transfer heat from one point to another through very limited space openings. The heat pipe possesses an extraordinary heat transfer capacity and rate with a very little temperature gradient generated along the pipe.

BRIEF DESCRIPTION OF THE DRAWINGS

These and other aspects of the invention may be understood by reference to the following detailed description, taken in conjunction with the accompanying drawings, which are briefly described below:

FIG. 1 is a perspective view of a radiation detector system having heat pipe based cooling in an exemplary embodiment according to the present invention;

FIG. 2 is another perspective view of the radiation detector system of FIG. 1;

FIG. 3 is a partially cross-sectional side view of the radiation detector system of FIG. 2, with a cross-section taken along the line A—A.

FIG. 4 is a schematic cross-sectional view of a radiation detector system having heat pipe based cooling, coupled to a controller, in an exemplary embodiment according to the present invention; and FIG. 5 is a schematic cross-sectional view of a radiation detector system having heat pipe based cooling, coupled to a controller, in another exemplary embodiment according to the present invention.

DETAILED DESCRIPTION

In exemplary embodiments of the present invention, a heat pipe has a first end (i.e., an evaporator end) thermally coupled to a hot side of a TEC (single-stage or multi-stage) via an evaporator and a second end (i.e., a condenser end) thermally coupled to a heat removing device via a condenser. The first end of the heat pipe may be fittingly slid into a generally cylindrical cavity formed about the center axis of the evaporator. The second end of the heat pipe is thermally coupled to a condenser, which is thermally coupled to the heat removing device. This way, the heat pipe is used to transfer heat generated by the TEC to the heat removing device through the heat pipe for dissipation to the surrounding environment.

The heat removal device, by way of example, may be a heat sink, a water cooling system, a refrigeration system, or another TEC (single-stage or multi-stage). The heat removal device may be coupled to a heat dissipation device for dissipating heat from the heat removal device to the surrounding environment. The heat dissipation device may be a fan, a natural convection heat sink or a radiator, for example.

FIGS. 1 and 2 are perspective views of a radiation detector system having heat pipe based cooling in an exemplary embodiment according to the present invention. FIG. 3 is a partially cross-sectional side view, with the cross-section taken along the A—A line of the radiation detector system of FIG. 2. The system of FIGS. 1–3, by way of example, is for applications in radiation spectroscopy. The heat pipe based cooling illustrated in FIGS. 1–3 may also have a number of other cooling applications.

As can be seen in FIGS. 1–3, the radiation detector system with heat pipe based cooling includes a heat pipe 1, and a TEC 2, a radiation detector 3 and front-end electronic components 4 mounted near an evaporator end of the heat pipe 1. The radiation detector 3 is mounted on, and is thermally coupled to the TEC 2. The radiation detector 3, for example, may have a normal operating temperature of −10° C. to −100° C. The radiation detector may operate at different temperatures in different embodiments.

In the described embodiment, the heat pipe 1 has a shape of an elongated cylinder. In other embodiments, the heat pipe 1 has other shapes such as that of a spring for damping vibrations, or a curved configuration, so as to accommodate special geometries of spectrometers with which the radiation detector system is used. The heat pipe 1, for example, may be Model No. HP1-06-150 available from Thermacore® International, Inc., Lancaster, Pa.

The TEC 2, which may be single-stage or multi-stage, is mounted on an evaporator 5, which is thermally coupled to the heat pipe 1. By way of example, the TEC 2 may have three stages. The evaporator 5 has a generally cylindrical shape, and is fittingly mounted inside a cap 6, which is also generally cylindrical. In the described embodiment, the evaporator 5 has an elongated cavity formed about its center axis for receiving the heat pipe 1. When installed, about half the length of the heat pipe 1 is inserted into the cavity of the evaporator 5 in the described embodiment as can be seen in FIG. 3.

While it is not shown in FIG. 3, there may be a gap of 20 µm to 50 µm between the wall of the evaporator cavity and the heat pipe 1, such that the heat pipe 1 can be slid in or out of the cavity with relative ease. A thermal grease, solder, or thermal conductive epoxy, may be placed in the gap to aid with both the heat transfer and the relative movement between the heat pipe 1 and the evaporator 5.

The front-end electronic components 4 may include read-out electronics, amplifying circuitry (e.g., a first signal amplification stage), and/or the like, which are typically used for receiving/processing signals generated by a radiation detector. The front end electronic components 4 may also include a FET, a feedback capacitor or any other suitable feedback mechanism, which may provide the temperature data at the radiation detector 3 (i.e., cold side of the TEC 2) to an external controller 14 (shown in FIG. 4, for example). In other embodiment, the front-end electronic components 4 may also include a thermistor or the like, which may provide the temperature data at the radiation detector 3 (i.e., cold side of the TEC 2) to an external controller 14 (shown in FIG. 4, for example) for controlling/maintaining temperature of the radiation detector 3 during normal operations.

The radiation detector 3, by way of example, may be a detector having a silicon structure such as low leakage current p-i-n or drift type detectors. The radiation detector 3 may also be a high resistivity compound semiconductor detector such as, for example, a $HgI_2$, CdTe or CdZnTe detector, which allows for construction of high energy resolution, spectroscopy systems. Further, the radiation detector 3 may be based on Si[Li] structure or any other suitable radiation detector structure for spectroscopic or other applications.

The TEC 2, the radiation detector 3 and the front-end electronic components 4 are placed inside the cap 6, which is mounted to a base plate 12, and held in a vacuum. The cap 6 and the base plate 12, by way of example, is made of metal such as aluminum or stainless steel. As can be seen in FIG. 3, the cap 6 is attached to the base plate 12 using a number of fasteners 16 (e.g., nut/bolt combination), and then the enclosed space is hermetically sealed. In other embodiments, at least a portion of the heat pipe 1 may also be held in a vacuum.

The vacuum is created and maintained inside the cap 6 by an external pump 7 (shown in FIG. 4 for example), which may be an ion pump or a getter pump, for example. For instance, the pressure inside the cap 6 may be between $10^{-6}$ torr to $10^{-5}$ torr while the vacuum is being maintained. The vacuum condition maybe replaced with dry gas such as nitrogen ($N_2$). The cap 6 has a window 15, through which the radiation detector 3 detects radiation. The window 15, by way of example, may be made of beryllium (Be), a polymer supported by silicon grid available from Moxtek™, Inc., Orem, Utah, or other suitable material.

The other end of the heat pipe 1 is thermally coupled to a condenser 8, which is thermally coupled to a heat sink 9 which dissipates heat energy into the surrounding environment. A solder, or thermal conductive epoxy, may be used for coupling the heat pipe to the condenser. The heat sink 9 may also be referred to as a heat removal device. As can be seen in FIGS. 1 and 3, the second end of the heat pipe 1 is disposed between the condenser 8 and the heat sink 9.

The condenser 8 has a generally rectangular shape, and is attached to the heat sink 9 via a plurality of fasteners 18 as can be seen in FIG. 1. The heat sink 9 has a generally rectangular box-like shape, and has formed thereon a plurality of protruding ribs 19. As those skilled in the art would appreciate, the ribs are used to increase the surface area through which the heat dissipates. The condenser 8 and the heat sink 9, for example, may be made of metal such as copper or aluminum. Also, the condenser 8 and the heat sink 9 may have any other suitable shape/configuration in other embodiments. The radiation detector system also includes a fan 10 for dissipating heat to the surrounding environment to reduce a temperature gradient between the heat sink 9 and the surrounding environment. The fan 10 may also be referred to as a heat dissipation device.

FIG. 4 is a schematic cross-sectional view of the radiation detector system of FIGS. 1–3, which will be used to describe the operation of the heat pipe based cooling operation. The heat pipe 1 is a passive heat transfer device, which has an extremely high effective thermal conductivity through a relatively small diameter pipe. By way of example, the heat pipe 1 may include a vacuum sealed tube with its inner walls lined with a wick structure and a hollow core. The tube is partially charged with a working fluid, which serves as the heat transfer media. Because the heat pipe is evacuated and then charged with the working fluid prior to being sealed, the internal pressure is set by the vapor pressure of the working fluid. The working fluid, for example, may be water, alcohol or any other fluid suitable for absorbing heat.

During operation of the radiation detector system, for proper functionality, the radiation detector 3 should be cooled down. As the operating temperature of the radiation detector 3 must be controlled (e.g., to a temperature between −10° C. and −100° C.), the TEC 2 is used to cool the radiation detector 3. The TEC 2 also absorbs heat generated by the radiation detector 3. When the heat pipe is heated at the evaporator end (i.e., end near the TEC 2) by the heat generated by the TEC 2, the working fluid absorbs heat and evaporates. This vapor travels through the hollow core of the heat pipe to the condenser end at very high speed (e.g., the sonic speed). At the condenser end, heat energy is removed by the condenser 8 and the heat sink 9, and released to the surrounding environment using the fan 10.

Due to the heat release, the vapor condenses back to liquid. The liquid then travels back to the evaporator end via the wick by capillary action and the process is repeated. This repeated process allows for large quantities of heat to be transferred through a relatively small diameter tube with a very low temperature gradient between the evaporator and condenser ends. By way of example, the temperature gradient generated due to 5 W heat energy conducting along the heat pipe with 0.6 cm diameter and 15 cm length is only approximately 0.5° C.

The radiation detection system of FIG. 4 also includes a controller 14 for providing power (e.g., current) to the TEC 4, and for receiving a feedback signal from the front-end electronic components 4 to maintain substantially constant temperature (e.g., temperature between −10° C. to −100° C.

with stability of ±0.1° C.) at the cold side (i.e., the side abutting the radiation detector 3) of the TEC 2 independently of the ambient temperature.

Certain applications may require maintenance of the detector operating temperature without using a fan in a wide temperature range of the environment. In this case a heat pipe may have at the condenser end (i.e., near the heat sink), thermally coupled a condenser, an additional TEC and a natural convection heat sink ("radiator").

As can be seen in FIG. 5, the radiation detector system with heat pipe based cooling in another exemplary embodiment of the present invention includes a heat pipe 21 having a TEC 22, a radiation detector 23 and front-end electronic components 24 mounted near an evaporation end (i.e., the end near the TEC 22). The TEC 22 is mounted on an evaporator 25, which is thermally connected to the heat pipe 21. The TEC 22 and the front-end electronic components 24 are placed inside a vacuum sealed cap 26, which is mounted to a base plate 32, and held in a vacuum. This vacuum typically is created and maintained by a pump 27, which may be an ion pump or a getter pump, for example.

The heat pipe 21, the TEC 22, the radiation detector 23, the front-end electronic components 24, the evaporator 25, the cap 26, the pump 27, the condenser 28 and the base plate 32 of FIG. 5 are substantially the same as the corresponding components of FIGS. 1–4, except that the heat pipe 21 has a curved configuration, and will not be discussed in detail herein.

The cooling operation of the radiation detector system with heat pipe based cooling of FIG. 5 is substantially the same as that of the system of FIGS. 1–4, except that the heat is released to the surrounding environment using a heat removal device 31 and a heat dissipation device 29. The heat removal device 31 and the heat dissipation device 29 may be considered a single cooling device, and may actually be implemented as a single device in other embodiments.

The condenser end of the heat pipe 21 is thermally coupled to the condenser 28, which is thermally coupled to the heat removal device 31. The heat removal device 31 transfers the heat from the condenser 28 to the heat dissipation device 29, which dissipates heat energy into the surrounding environment. By way of example, the heat removal device 31 may include a TEC (single-stage or multi-stage), a water cooling system, a refrigeration system, or the like. The heat dissipation device 29 may be a radiator, a heat sink or any other suitable device for dissipating heat to the surrounding environment. In other embodiments, a fan may be used as a heat dissipation device instead of or in addition to the heat dissipation device 29 and/or the heat removal device 31.

The radiation detector system of FIG. 5 also includes a controller 34 for providing power (e.g., current) to the front TEC 22, and for receiving a feedback signal from the front-end electronic components to maintain substantially constant temperature (e.g., temperature between −10° C. to −100° C. with stability of ±0.1° C.) at the cold side (i.e., the side abutting the radiation detector 3) of the TEC 2 independently of the ambient temperature. Further, the controller 34 may also regulate the temperature of the heat removal device 31 thermally coupled to the condenser end of the heat pipe 21 using a feedback signal received from the front-end electronic components 24 and/or other electronic circuitry (not shown) disposed near the heat removal device 31.

It will be appreciated by those of ordinary skill in the art that the present invention can be embodied in other specific forms without departing from the spirit or essential character hereof. The present description is therefore considered in all respects to be illustrative and not restrictive. The scope of the present invention is indicated by the appended claims, and all changes that come within the meaning and range of equivalents thereof are intended to be embraced therein.

The invention claimed is:

1. A radiation detector system comprising:
   a radiation detector for use with a spectrometer;
   a TEC thermally coupled to the radiation detector for cooling the radiation detector, whereby heat is primarily generated by the TEC;
   a heat removal device for dissipating the heat generated by the TEC to surrounding environment; and
   a heat pipe having a first end thermally coupled to the TEC to receive the heat generated by the TEC, and a second end thermally coupled to the heat removal device, wherein the heat pipe transfers the heat generated by the TEC from the first end to the second end to be removed by the heat removal device.

2. The radiation detector system of claim 1, wherein the heat removal device includes a heat sink.

3. The radiation detector system of claim 2, further comprising a fan disposed proximately to the heat sink for dissipating the heat from the heat sink to the surrounding environment.

4. The radiation detector system of claim 1, wherein the heat removal device includes a water cooling system or a refrigeration system.

5. The radiation detector system of claim 1, wherein the heat removal device comprises a second TEC having a cold side thermally coupled to the second end of the heat pipe to remove the heat therefrom and a hot side thermally coupled to a radiator for dissipating the heat to the surrounding environment.

6. The radiation detector system of claim 1, further comprising front-end electronics for providing a first signal amplification stage and a feedback signal based on a temperature of the radiation detector, and a controller for regulating a current flow in the TEC in response to a feedback signal to maintain a substantially constant temperature at the cold side of the TEC.

7. The radiation detector system of claim 5, further comprising electronic circuitry for providing a first feedback signal based on a temperature of the radiation detector and a second feedback signal based on a temperature of the cold side of the second TEC, and a controller for regulating a current flow in the TEC in response to the first feedback signal to maintain a substantially constant temperature at the cold side of the TEC, and for regulating a current flow in the second TEC in response to the second feedback signal to maintain another substantially constant temperature at the cold side of the second TEC.

8. The radiation detector system of claim 1, further comprising front end electronic components, wherein the radiation detector and the front-end electronic components are contained either in vacuum or dry gas, and wherein at least a portion of the heat pipe is placed outside said vacuum or dry gas.

9. The radiation detector system of claim 1, further comprising front end electronic components, wherein the radiation detector, the front-end electronic components, the TEC and at least a portion of the heat pipe are contained either in vacuum or dry gas.

10. The radiation detector system of claim 1, wherein the heat pipe is formed as a straight rod.

11. The radiation detector system of claim 1, wherein the heat pipe is formed as a spring to damp vibrations.

12. The radiation detector system of claim 1, wherein the heat pipe is thermally coupled with at least one of the TEC and the heat removal device using solder.

13. The radiation detector system of claim 1, wherein the heat pipe is thermally coupled with at least one of the TEC and the heat removal device using a thermal compound.

14. The radiation detector system of claim 1, wherein the heat pipe is thermally coupled with either the TEC or the heat removal device using solder and thermally coupled with the other of the TEC and the heat removal device using a thermal compound.

15. The radiation detector system of claim 1, wherein the radiation detector is a low leakage current p-i-n, a drift type detector, a high resistivity compound semiconductor detector, or a Si(Li) detector.

16. A radiation detector system comprising:
 a spectrometer comprising radiation detection means;
 a TEC thermally coupled to the radiation detection means for cooling the radiation detection means, whereby heat is generated by the TEC;
 heat removal means for dissipating the heat generated by the TEC to surrounding environment; and
 a heat pipe having a first end thermally coupled to the TEC to receive the heat generated by the TEC, and a second end thermally coupled to the heat removal means, wherein the heat pipe transfers the heat generated by the TEC from the first end to the second end.

17. The radiation detector system of claim 16, wherein the heat removal means includes a heat sink.

18. The radiation detector system of claim 17, further comprising heat dissipation means disposed proximately to the heat sink for dissipating the heat from the heat sink to the surrounding environment.

19. The radiation detector system of claim 16, wherein the heat removal means comprises a second TEC whose cold side is thermally coupled to the second end of the heat pipe and whose hot side is thermally coupled to a radiator for dissipating the heat to the surrounding environment.

* * * * *